(12) United States Patent
Nakafuji et al.

(10) Patent No.: US 11,880,138 B2
(45) Date of Patent: Jan. 23, 2024

(54) COMPOSITION, PATTERN-FORMING METHOD, AND COMPOUND-PRODUCING METHOD

(71) Applicant: JSR CORPORATION, Tokyo (JP)

(72) Inventors: Shin-ya Nakafuji, Tokyo (JP); Hiroki Nakatsu, Tokyo (JP); Tomoaki Taniguchi, Tokyo (JP); Tomohiro Oda, Tokyo (JP)

(73) Assignee: JSR CORPORATION, Tokyo (JP)

( * ) Notice: Subject to any disclaimer, the term of this patent is extended or adjusted under 35 U.S.C. 154(b) by 322 days.

(21) Appl. No.: 17/163,675

(22) Filed: Feb. 1, 2021

(65) Prior Publication Data

US 2021/0157235 A1 May 27, 2021

Related U.S. Application Data

(63) Continuation of application No. PCT/JP2019/029310, filed on Jul. 25, 2019.

(30) Foreign Application Priority Data

Aug. 9, 2018 (JP) .................................. 2018-150401

(51) Int. Cl.
| | | |
|---|---|---|
| G03F 7/11 | (2006.01) | |
| G03F 7/09 | (2006.01) | |
| C08G 61/10 | (2006.01) | |
| G03F 7/075 | (2006.01) | |
| G03F 7/20 | (2006.01) | |

(52) U.S. Cl.
CPC ............... *G03F 7/11* (2013.01); *C08G 61/10* (2013.01); *G03F 7/075* (2013.01); *G03F 7/091* (2013.01); *G03F 7/2004* (2013.01); *C08G 2261/1422* (2013.01); *C08G 2261/3142* (2013.01)

(58) Field of Classification Search
CPC .................................... G03F 7/11; G03F 7/091
See application file for complete search history.

(56) References Cited

U.S. PATENT DOCUMENTS

| | | | |
|---|---|---|---|
| 9,581,905 B2 | 2/2017 | Nakafuji et al. | |
| 9,746,772 B2 * | 8/2017 | Okuyama | ............ C09D 171/00 |
| 2016/0085152 A1 | 3/2016 | Nakafuji et al. | |
| 2019/0094695 A1 | 3/2019 | Nosaka et al. | |

FOREIGN PATENT DOCUMENTS

| | | |
|---|---|---|
| JP | 2013083833 A | 5/2013 |
| WO | WO-2014208324 A1 | 12/2014 |
| WO | WO-2017208796 A1 | 12/2017 |

OTHER PUBLICATIONS

International Search Report dated Oct. 15, 2019 in PCT/JP2019/029310 (with English translation), 10 pages.
Written Opinion dated Oct. 15, 2019 in PCT/JP2019/029310 (with English translation), 15 pages.
Combined Office Action and Search Report dated Nov. 29, 2022 in Taiwanese Patent Application No. 108128120 (with English translation), 21 pages.
Office Action dated Oct. 4, 2022 in Japanese Patent Application No. 2020-536462 (with English translation), 7 pages, This English translation of the Office Action has been provided from the JPO One Portal Dossier.

* cited by examiner

*Primary Examiner* — John S Chu
(74) *Attorney, Agent, or Firm* — Element IP, PLC

(57) ABSTRACT

A composition that enables a resist underlayer film to be formed, contains: a compound having at least one partial structure represented by formula (1); and a solvent. In the formula (1), for example, $Ar^1$ represents a group obtained by removing (p+1) hydrogen atoms on an aromatic carbon ring from a substituted or unsubstituted arene having 6 to 30 ring atoms, or a group obtained by removing (p+1) hydrogen atoms on an aromatic heteroring from a substituted or unsubstituted heteroarene having 5 to 30 ring atoms; $Ar^2$ represents a substituted or unsubstituted aryl group having 6 to 30 ring atoms, or a substituted or unsubstituted heteroaryl group having 5 to 30 ring atoms, and $R^2$ represents a hydrogen atom or a monovalent organic group having 1 to 20 carbon atoms, and $R^3$ represents an ethynediyl group or a substituted or unsubstituted ethenediyl group.

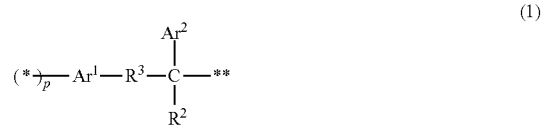

(1)

7 Claims, 1 Drawing Sheet

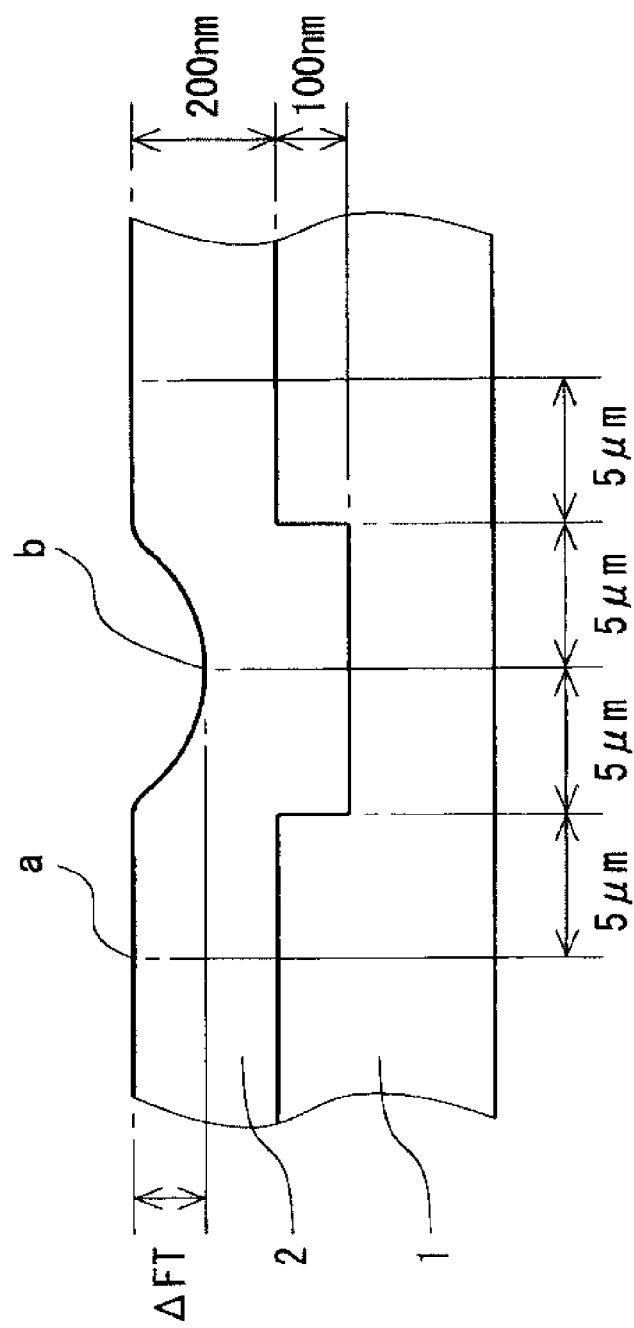

COMPOSITION, PATTERN-FORMING METHOD, AND COMPOUND-PRODUCING METHOD

CROSS-REFERENCE TO RELATED APPLICATIONS

The present application is a continuation application of International Application No. PCT/JP2019/029310, filed Jul. 25, 2019, which claims priority to Japanese Patent Application No. 2018-150401 filed Aug. 9, 2018. The contents of these applications are incorporated herein by reference in their entirety.

BACKGROUND OF THE INVENTION

Field of the Invention

The present invention relates to a composition, a pattern-forming method, and a compound-producing method.

Description of the Related Art

In manufacturing semiconductor devices, a method has been employed in which a resist underlayer film is formed directly or indirectly on a substrate, from a composition for forming a resist underlayer film, and a resist pattern is formed directly or indirectly on the resist underlayer film by using a composition for forming a resist film or the like. The resist underlayer film is etched by using the resist pattern as a mask, and further, the substrate can be etched by using the resultant resist underlayer film pattern as a mask.

Materials for use in such a composition for forming a resist underlayer film have been variously investigated (see Japanese Unexamined Patent Application, Publication No. 2013-83833).

SUMMARY OF THE INVENTION

According to an aspect of the present invention, a composition which enables a resist underlayer film to be formed, includes: a compound comprising at least one partial structure represented by formula (1); and a solvent.

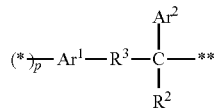
(1)

In the formula (1), p is an integer of 0 to 17; $Ar^1$ represents a group obtained by removing (p+1) hydrogen atoms on an aromatic carbon ring from a substituted or unsubstituted arene having 6 to 30 ring atoms, or a group obtained by removing (p+1) hydrogen atoms on an aromatic heterring from a substituted or unsubstituted heteroarene having 5 to 30 ring atoms, wherein the arene having 6 to 30 ring atoms is anthracene, phenanthrene, tetracene, pyrene, pentacene, coronene, perylene, biphenyl, dimethylbiphenyl, diphenylbiphenyl, fluorene, or 9,9-diphenylfluorene; $Ar^2$ represents a substituted or unsubstituted aryl group having 6 to 30 ring atoms, or a substituted or unsubstituted heteroaryl group having 5 to 30 ring atoms, and $R^2$ represents a hydrogen atom or a monovalent organic group having 1 to 20 carbon atoms, or $Ar^2$ and $R^2$ taken together represent a ring structure having 3 to 20 ring atoms together with the carbon atom to which $Ar^2$ and $R^2$ bond; $R^3$ represents an ethynediyl group or a substituted or unsubstituted ethenediyl group; and * and ** each denote a site bonding to a part other than the partial structure represented by the formula (1), or to an other partial structure represented by the formula (1) in the compound.

According to another aspect of the present invention, a composition which enables a resist underlayer film to be formed, includes: a product of an acid-catalyzed condensation reaction of a compound represented by formula (A) and a compound represented by formula (B); and a solvent.

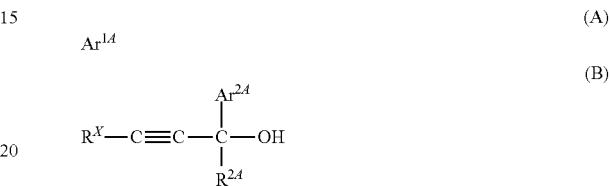

In the formula (A), $Ar^{1A}$ represents a substituted or unsubstituted arene having 6 to 30 ring atoms, or a substituted or unsubstituted heteroarene having 5 to 30 ring atoms, wherein the arene having 6 to 30 ring atoms is anthracene, phenanthrene, tetracene, pyrene, pentacene, coronene, perylene, biphenyl, dimethylbiphenyl, diphenylbiphenyl, fluorene, or 9,9-diphenylfluorene. In the formula (B), $Ar^{2A}$ represents a substituted or unsubstituted aryl group having 6 to 30 ring atoms, or a substituted or unsubstituted heteroaryl group having 5 to 30 ring atoms, and $R^{2A}$ represents a hydrogen atom or a monovalent organic group having 1 to 20 carbon atoms, or $Ar^{2A}$ and $R^{2A}$ taken together represent a ring structure having 3 to 20 ring atoms together with the carbon atom to which $Ar^{2A}$ and $R^{2A}$ bond; and $R^X$ represents a hydrogen atom or a monovalent organic group having 1 to 20 carbon atoms.

According to a further aspect of the present invention, a pattern-forming method includes applying the composition directly or indirectly on a substrate to form a resist underlayer film. A composition for forming a resist film is applied directly or indirectly on the resist underlayer film to form a resist film. The resist film is exposed to a radioactive ray. The resist film exposed is developed.

According to a further aspect of the present invention, a compound-producing method includes allowing a condensation reaction of a compound represented by formula (A) and a compound represented by formula (B) in a presence of an acid catalyst.

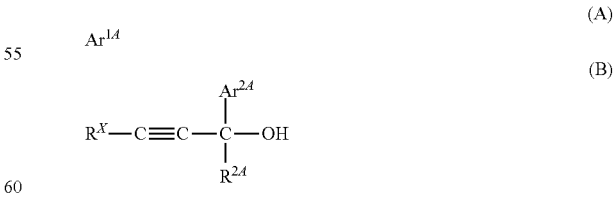

In the formula (A), $Ar^{1A}$ represents a substituted or unsubstituted arene having 6 to 30 ring atoms, or a substituted or unsubstituted heteroarene having 5 to 30 ring atoms, wherein the arene having 6 to 30 ring atoms is anthracene, phenanthrene, tetracene, pyrene, pentacene, coronene, perylene, biphenyl, dimethylbiphenyl, diphenylbiphenyl, fluorene, or 9,9-diphenylfluorene. In the formula (B), $Ar^{2A}$ represents a substituted or unsubstituted aryl group having 6 to 30 ring atoms, or a substituted or unsubstituted heteroaryl group having 5 to 30 ring atoms, and $R^{2A}$ represents a hydrogen atom or a monovalent organic group having 1 to 20 carbon atoms, or $Ar^{2A}$ and $R^{2A}$ taken together represent a ring structure having 3 to 20 ring atoms together with the carbon atom to which $Ar^{2A}$ and $R^{2A}$ bond; and $R^X$ represents a hydrogen atom or a monovalent organic group having 1 to 20 carbon atoms.

BRIEF DESCRIPTION OF THE DRAWING

The FIGURE is a schematic cross sectional view for illustrating a flatness evaluation method.

DESCRIPTION OF EMBODIMENTS

Recently, substrates having multiple types of trenches, particularly trenches with aspect ratios that are different from one another, have been employed. In this case, the composition for forming a resist underlayer film needs to be capable of forming a resist underlayer film superior in flatness. Furthermore, a multilayer resist process in which a silicon-containing film is formed as an intermediate layer on a resist underlayer film has been investigated recently. In this case, it is necessary that the resist underlayer film enables generation of defects such as cracks and peeling to be prevented on the surface of the silicon-containing film, and thus has a superior inhibitory ability of film defects.

According to one embodiment of the invention, a composition for forming a resist underlayer film (i.e., a composition which enables a resist underlayer film to be formed, hereinafter, may be also referred to as "composition (I)") contains: a compound (hereinafter, may be also referred to as "(A) compound" or "compound (A)") having one or a plurality of partial structure(s) represented by the following formula (1) (hereinafter, may be also referred to as "partial structure (I)"); and a solvent (hereinafter, may be also referred to as "(B) solvent" or "solvent (B)").

(1)

In the formula (1), p is an integer of 0 to 17; $Ar^1$ represents a group obtained by removing (p+1) hydrogen atoms on an aromatic carbon ring from a substituted or unsubstituted arene having 6 to 30 ring atoms, or a group obtained by removing (p+1) hydrogen atoms on an aromatic heterring from a substituted or unsubstituted heteroarene having 5 to 30 ring atoms; $Ar^2$ represents a substituted or unsubstituted aryl group having 6 to 30 ring atoms, or a substituted or unsubstituted heteroaryl group having 5 to 30 ring atoms, and $R^2$ represents a hydrogen atom or a monovalent organic group having 1 to 20 carbon atoms, or $Ar^2$ and $R^2$ taken together represent a ring structure having 3 to 20 ring atoms together with the carbon atom to which $Ar^2$ and $R^2$ bond; $R^3$ represents an ethynediyl group or a substituted or unsubstituted ethenediyl group; and * and ** each denote a site bonding to a part other than the partial structure represented by the formula (1), or to an other partial structure represented by the above formula (1) in the compound (A).

According to another embodiment of the present invention, a composition for forming a resist underlayer film (i.e., a composition which enables a resist underlayer film to be formed, hereinafter, may be also referred to as "composition (II)") contains: a product of an acid-catalyzed condensation reaction (hereinafter, may be also referred to as "(A') condensation reaction product" or "condensation reaction product (A')") of a compound represented by the following formula (A) and a compound represented by the following formula (B); and a solvent (solvent (B)).

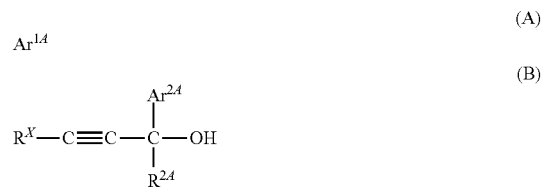

In the formula (A), $Ar^{1A}$ represents a substituted or unsubstituted arene having 6 to 30 ring atoms, or a substituted or unsubstituted heteroarene having 5 to 30 ring atoms.

In the formula (B), $Ar^{2A}$ represents a substituted or unsubstituted aryl group having 6 to 30 ring atoms, or a substituted or unsubstituted heteroaryl group having 5 to 30 ring atoms, and $R^{2A}$ represents a hydrogen atom or a monovalent organic group having 1 to 20 carbon atoms, or $Ar^{2A}$ and $R^{2A}$ taken together represent a ring structure having 3 to 20 ring atoms together with the carbon atom to which $Ar^{2A}$ and $R^{2A}$ bond; and $R^X$ represents a hydrogen atom or a monovalent organic group having 1 to 20 carbon atoms.

According to still another embodiment of the present invention, a resist underlayer film is formed from the composition for forming a resist underlayer film of the one embodiment of the present invention.

According to yet another embodiment of the present invention, a resist underlayer film-forming method includes applying directly or indirectly on a substrate, a composition for forming a resist underlayer film, the composition containing: a compound having one or a plurality of partial structure(s) represented by the above formula (1); and a solvent.

According to a further embodiment of the present invention, a pattern-forming method includes: applying directly or indirectly on a substrate, a composition for forming a resist underlayer film, the composition containing a solvent and a compound having one or a plurality of partial structure(s) represented by the above formula (1), to form a resist underlayer film; applying a composition for forming a resist film directly or indirectly on the resist underlayer film to form a resist film; exposing the resist film to a radioactive ray; and developing the resist film exposed.

According to a yet further embodiment of the present invention, a compound has one or a plurality of partial structure(s) represented by the above formula (1).

According to a still further embodiment of the present invention, a compound-producing method includes allowing a condensation reaction of a compound represented by the above formula (A) and a compound represented by the above formula (B) in the presence of an acid catalyst.

Herein, the "organic group" as referred to means a group that includes at least one carbon atom.

The composition for forming a resist underlayer film of the one embodiment of the present invention enables a resist underlayer film superior in etching resistance, heat resistance, flatness, and inhibitory ability of film defects to be formed. The resist underlayer film of the still another embodiment of the present invention is superior in etching resistance, heat resistance, flatness, and inhibitory ability of film defects. The resist underlayer film-forming method of the yet another embodiment of the present invention enables a resist underlayer film superior in etching resistance, heat resistance, flatness, and inhibitory ability of film defects to be formed. The pattern-forming method of the further embodiment of the present invention enables a pattern having a favorable shape to be obtained by using such a superior resist underlayer film. The compound of the yet further embodiment of the present invention can be suitably used as a component of the composition for forming a resist underlayer film of the one embodiment of the present invention. The compound-producing method of the still further embodiment of the present invention enables the compound of the yet further embodiment of the present invention to be produced. Therefore, these can be suitably used for manufacture of semiconductor devices and the like, for which microfabrication is expected to progress further hereafter.

Composition for Forming Resist Underlayer Film

Modes of the composition for forming a resist underlayer film (hereinafter, may be also merely referred to as "composition") include the composition (I) and the composition (II) presented below.

Composition (I): containing the compound (A) and the solvent (B)

Composition (II): containing the condensation reaction product (A') and the solvent (B)

Due to containing the compound (A) or the condensation reaction product (A'), the composition enables a resist underlayer film superior in etching resistance, heat resistance, flatness, and inhibitory ability of film defects to be formed. Although not necessarily clarified and without wishing to be bound by any theory, the reason for achieving the effects described above due to the composition having the constitution described above may be supposed as in the following, for example. To explain specifically, the compound (A) and the condensation reaction product (A') each have a specific partial structure in which the aromatic ring of $Ar^1$ in the above formula (1) and the carbon atom to which the aromatic ring of $Ar^2$ bonds are linked via the ethenediyl group or the ethynediyl group. It is considered that the resist underlayer film to be formed has improved flatness, and etching resistance, heat resistance, and inhibitory ability of film defects since the compound (A) or the like has such a structure. The composition can be particularly suitably used in a multilayer resist process.

The composition (I) and the composition (II) will be described below in this order.

Composition (I)

The composition (I) contains the compound (A) and the solvent (B). The composition (I) may also contain optional component(s) within a range not leading to impairment of the effects of the present invention.

Each component will be described below.

(A) Compound

The compound (A) has the partial structure (I). The partial structure (I) is represented by the following formula (1).

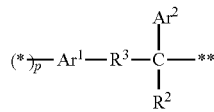

(1)

In the above formula (1), p is an integer of 0 to 17; $Ar^1$ represents a group obtained by removing (p+1) hydrogen atoms on an aromatic carbon ring from a substituted or unsubstituted arene having 6 to 30 ring atoms, or a group obtained by removing (p+1) hydrogen atoms on an aromatic heteroring from a substituted or unsubstituted heteroarene having 5 to 30 ring atoms; $Ar^2$ represents a substituted or unsubstituted aryl group having 6 to 30 ring atoms, or a substituted or unsubstituted heteroaryl group having 5 to 30 ring atoms, and $R^2$ represents a hydrogen atom or a monovalent organic group having 1 to 20 carbon atoms, or $Ar^2$ and $R^2$ taken together represent a ring structure having 3 to 20 ring atoms together with the carbon atom to which $Ar^2$ and $R^2$ bond; $R^3$ represents an ethynediyl group or a substituted or unsubstituted ethenediyl group; and * and ** each denote a site bonding to a part other than the partial structure represented by the formula (1), or to an other partial structure represented by the above formula (1) in the compound (A).

The number of "ring atoms" as referred to herein means the number of atoms constituting a skeleton of the ring in an alicyclic structure, an aromatic ring structure, an aliphatic heterocyclic structure, or an aromatic heterocyclic structure. Specifically, in the case of the ring structure being monocyclic, the number of "ring atoms" as referred to means the number of atoms constituting the monocyclic skeleton thereof, and in the case of the ring structure being polycyclic, such as a fused ring or a bridged ring, the total number of "ring atoms" as referred to means the number of atoms constituting the polycyclic skeleton thereof. For example, the number of ring atoms of a naphthalene structure is 10, the number of ring atoms of a fluorene structure is 13, and the number of ring atoms of an adamantane structure is 10.

Examples of the arene having 6 to 30 ring atoms that gives $Ar^1$ include benzene, naphthalene, anthracene, phenanthrene, tetracene, pyrene, pentacene, coronene, perylene, biphenyl, dimethylbiphenyl, diphenylbiphenyl, fluorene, 9,9-diphenylfluorene, and the like.

Examples of the heteroarene having 5 to 30 ring atoms that gives $Ar^1$ include: nitrogen atom-containing aromatic heterocyclic compounds such as pyrrole, pyridine, quinoline, isoquinoline, indole, pyrazine, pyrimidine, pyridazine, and triazine; oxygen atom-containing aromatic heterocyclic compounds such as furan, pyran, benzofuran, and benzopyran; sulfur atom-containing aromatic heterocyclic compounds such as thiophene and benzothiophene; and the like.

A substituent for the arene and the heteroarene in $Ar^1$ is exemplified by a monovalent or divalent organic group having 1 to 20 carbon atoms, a hydroxy group, a sulfanyl group, a nitro group, a halogen atom, and the like.

Exemplary monovalent organic groups having 1 to 20 carbon atoms include: a monovalent hydrocarbon group having 1 to 20 carbon atoms, a group having a divalent hetero atom-containing group between two adjacent carbon atoms of the hydrocarbon group having 1 to 20 carbon atoms; a group obtained by substituting with a monovalent hetero atom-containing group, a part or all of hydrogen atoms of the hydrocarbon group having 1 to 20 carbon atoms or of the group having the divalent hetero atom-containing group; and the like.

Examples of the monovalent hydrocarbon group having 1 to 20 carbon atoms include:

chain hydrocarbon groups, e.g., alkyl groups such as a methyl group, an ethyl group, a propyl group, a butyl group, and a pentyl group; alkenyl groups such as an ethenyl group, a propenyl group, and a butenyl group; alkynyl groups such as an ethynyl group, a propynyl group, and a butynyl group;

alicyclic hydrocarbon groups, e.g., cycloalkyl groups such as a cyclopentyl group and a cyclohexyl group; cycloalkenyl groups such as a cyclopropenyl group, a cyclopentenyl group, and a cyclohexenyl group; bridged cyclic hydrocarbon groups such as a norbornyl group and an adamantyl group;

aromatic hydrocarbon groups, e.g., aryl groups such as a phenyl group, a tolyl group, a xylyl group, and a naphthyl group; aralkyl groups such as a benzyl group, a phenethyl group, and a naphthylmethyl group; and the like.

Examples of the divalent hetero atom-containing group include CO—, —CS—, —NH—, —O—, —S—, groups obtained by combining these, and the like.

Examples of the monovalent hetero atom-containing group include a hydroxy group, a sulfanyl group, a cyano group, a nitro group, a halogen atom, and the like.

The divalent organic group having 1 to 20 carbon atoms is exemplified by groups obtained by removing one hydrogen atom from the group exemplified above as the monovalent organic group having 1 to 20 carbon atoms, and the like.

The number of the substituents for the arene or the heteroarene in $Ar^1$ is preferably 0 to 5, more preferably 0 to 2, and still more preferably 0 or 1.

$Ar^1$ is preferably a group derived from a substituted or unsubstituted arene. The arene is preferably benzene, naphthalene, anthracene, phenanthrene, pyrene, coronene, or perylene. The substituent in $Ar^1$ is preferably the monovalent or divalent organic group, a halogen atom, or a nitro group, and more preferably a chain hydrocarbon group, an alicyclic hydrocarbon group, —OR', —NR'$_2$, or —NR'— (wherein R' represents a monovalent organic group having 1 to 20 carbon atoms). It is still more preferred that the substituent in $Ar^1$ be a group not including an oxygen atom. When the substituent in $Ar^1$ is the group not including an oxygen atom, the etching resistance can be further improved. The group not including an oxygen atom is preferably a chain hydrocarbon group or an alicyclic hydrocarbon group, more preferably a chain hydrocarbon group, still more preferably an alkenyl group or an alkynyl group, and particularly preferably an ethenyl group, a propenyl group, an ethynyl group, or a propynyl group.

In the above formula (1), p is preferably 0 to 5, more preferably 0 to 3, still more preferably 0 to 2, particularly preferably 0 or 1, and more particularly preferably 1.

The substituted or unsubstituted aryl group having 6 to 30 ring atoms, or the substituted or unsubstituted heteroaryl group having 5 to 30 ring atoms which may be represented by $Ar^2$ is exemplified by groups obtained by removing one hydrogen atom on the aromatic carbon ring or on the aromatic heteroring from the compound exemplified as the substituted or unsubstituted arene having 6 to 30 ring atoms, or the substituted or unsubstituted heteroarene having 5 to 30 ring atoms that gives $Ar^1$, and the like.

The monovalent organic group having 1 to 20 carbon atoms which may be represented by $R^2$ is exemplified by groups similar to the monovalent organic groups having 1 to 20 carbon atoms exemplified as the substituent for the arene or the heteroarene in $Ar^1$, and the like.

Examples of the ring structure having 3 to 20 ring atoms which may be represented by $Ar^2$ and $R^2$ taken together include: alicyclic structures such as a cyclopropane structure, a cyclobutane structure, a cyclopentane structure, and a cyclohexane structure; aromatic ring structures such as a fluorene structure; and the like.

Regarding $Ar^2$ and $R^2$, it is preferred that $Ar^2$ and $R^2$ each represent the monovalent aromatic hydrocarbon group, or $Ar^2$ and $R^2$ taken together represent a part of the aromatic ring structure, and it is more preferred that $Ar^2$ and $R^2$ each represent a phenyl group, or $Ar^2$ and $R^2$ taken together represent a part of a fluorene structure.

The substituent for the ethenediyl group which may be represented by $R^3$ is exemplified by a monovalent hydrocarbon group having 1 to 20 carbon atoms, and the like. Of these, a chain hydrocarbon group is preferred, and an alkyl group is more preferred.

$R^3$ represents preferably an unsubstituted ethenediyl group or ethynediyl group.

The partial structure (I) is exemplified by structures represented by the following formulae (1-1) to (1-15) (hereinafter, may be also referred to as "partial structures (I-1) to (I-15)"), and the like.

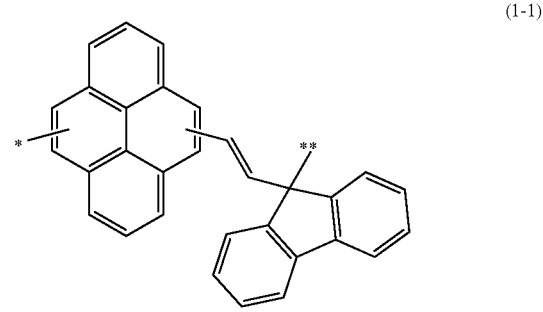

(1-1)

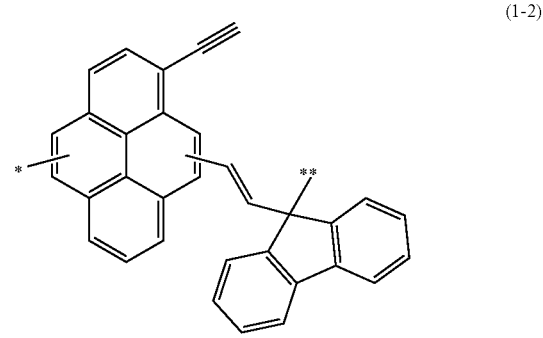

(1-2)

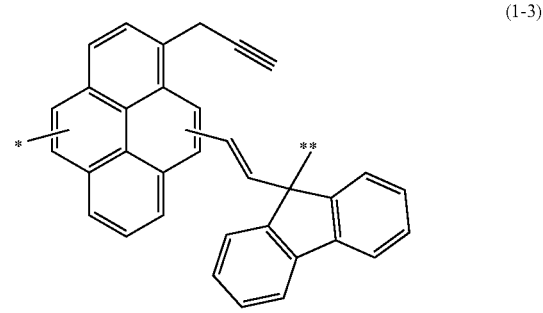

(1-3)

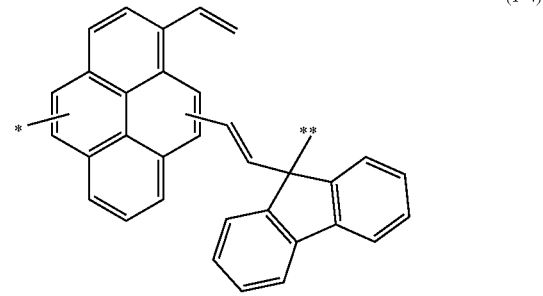

(1-4)

(1-5)

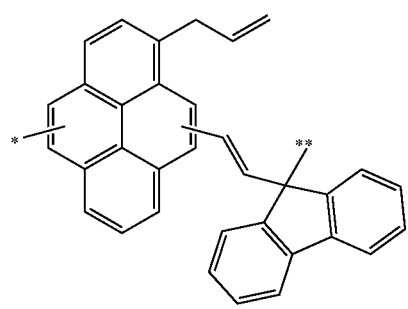
(1-6)

(1-7)
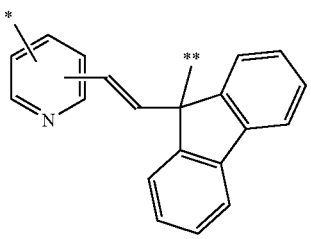

(1-8)
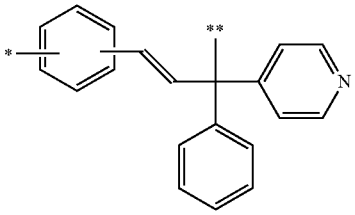

(1-9)
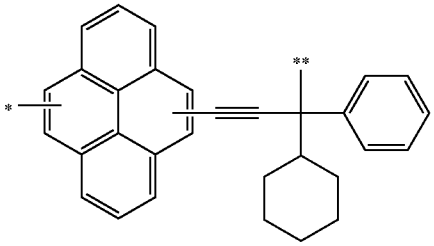

(1-10)

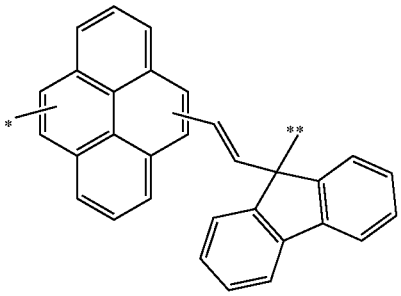
(1-11)

(1-12)

(1-13)

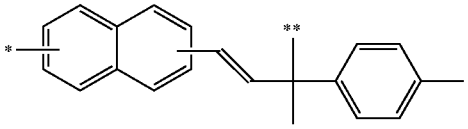
(1-14)

(1-15)
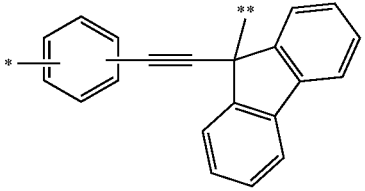

In the above formulae (1-1) to (1-15), * and ** are as defined in the above formula (1).

As the partial structure (I), the partial structures (I-1) to (I-10) are preferred.

The compound (A) may have one partial structure (I), or a plurality of the partial structures (I). The compound (A) may have only one type of the partial structure (I), or may have two or more types of the partial structure (I). In addition to the partial structure (I), the compound (A) may also have an other partial structure. The other partial structure is exemplified by a partial structure derived from a phenol compound and an aldehyde compound, and the like.

As the compound (A), a compound consisting of only carbon atoms and hydrogen atoms is preferred. When the compound (A) consists of only carbon atoms and hydrogen atoms, the etching resistance of the resist underlayer film can be further improved. Such a compound (A) is exemplified by a compound consisting of only the partial structure (I), wherein: $Ar^1$ and $Ar^2$ in the above formula (1) are derived from an unsubstituted or hydrocarbon group-substituted arene; $R^2$ represents a hydrogen atom or a hydrocarbon group; and $R^3$ represents an unsubstituted ethenediyl group or an ethynediyl group, and the like.

As the compound (A), a polymer having a repeating unit (hereinafter, may be also referred to as "repeating unit (I)") as the partial structure, in which p in the above formula (1) is 1, and the like may be exemplified. In other words, the compound (A) is exemplified by a polymer having a repeating unit (I) represented by the following formula (i), and the like. The compound (A) may also have an other repeating unit in addition to the repeating unit (I). The other repeating unit is exemplified by a repeating unit derived from a phenol compound and an aldehyde compound, and the like.

(i)

In the above formula (i), $Ar^{11}$ represents a substituted or unsubstituted arenediyl group having 6 to 30 ring atoms, or a substituted or unsubstituted heteroarenediyl group having 5 to 30 ring atoms; and $Ar^2$, $R^2$ and $R^3$ are as defined in the above formula (1).

The substituted or unsubstituted arenediyl group having 6 to 30 ring atoms, or the substituted or unsubstituted heteroarenediyl group having 5 to 30 ring atoms which may be represented by $Ar^{11}$ is exemplified by a group obtained by removing one hydrogen atom on the aromatic carbon ring or on the aromatic heteroring of the substituted or unsubstituted aryl group having 6 to 30 ring atoms, or the substituted or unsubstituted heteroaryl group having 5 to 30 ring atoms which may be represented by $Ar^2$, and the like.

The lower limit of a molecular weight of the compound (A) is preferably 300, more preferably 500, still more preferably 1,000, and particularly preferably 1,500. The upper limit of the molecular weight is preferably 100,000, more preferably 50,000, still more preferably 10,000, particularly preferably 8,000, further particularly preferably 5,000, and most preferably 3,000. When the molecular weight of the compound (A) falls within the above range, the flatness of the resist underlayer film can be further improved. The compound (A) may be used either alone of one type, or in a combination of two or more types thereof. In the case in which two or more types of the compound (A) are used, the molecular weight of the compound (A) means a weight average molecular weight.

The lower limit of a percentage content of carbon atoms in the compound (A) is preferably 85% by mass, more preferably 90% by mass, still more preferably 93% by mass, and particularly preferably 95% by mass. The upper limit of the percentage content of the carbon atoms is, for example, 99.9% by mass, preferably 99% by mass, and more preferably 97% by mass.

The upper limit of a percentage content of hydrogen atoms in the compound (A) is preferably 7% by mass, more preferably 6% by mass, still more preferably 5% by mass, and particularly preferably 4% by mass. The lower limit of the percentage content of the hydrogen atoms is, for example, 0.1% by mass, preferably 1% by mass, and more preferably 2% by mass.

The upper limit of a percentage content of oxygen atoms in the compound (A) is preferably 10% by mass, more preferably 5% by mass, still more preferably 2% by mass, and particularly preferably 1% by mass. The percentage content of oxygen atoms may be 0% by mass.

When the percentage content of carbon atoms, hydrogen atoms or oxygen atoms in the compound (A) falls within the above range, the etching resistance can be further improved.

The lower limit of a content of the compound (A) with respect to all components other than the solvent (B) of the composition (I) is preferably 50% by mass, more preferably 70% by mass, and still more preferably 85% by mass. The upper limit of the content is, for example, 100% by mass.

The lower limit of a content of the compound (A) in the composition (I) is preferably 1% by mass, more preferably 3% by mass, and still more preferably 5% by mass. The upper limit of the content is preferably 50% by mass, more preferably 30% by mass, and still more preferably 15% by mass.

Compound-Producing Method

The compound (A) may be produced by, for example, a compound-producing method which includes a step of allowing a condensation reaction of a compound represented by the following formula (A) (hereinafter, may be also referred to as "compound (a)") and a compound represented by the following formula (B) (hereinafter, may be also referred to as "compound (b)") in the presence of an acid catalyst.

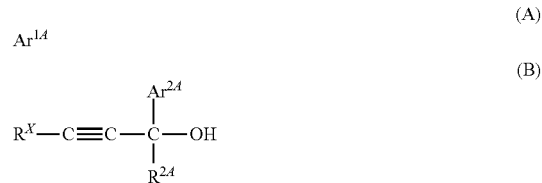

In the above formula (A), $Ar^{1A}$ represents a substituted or unsubstituted arene having 6 to 30 ring atoms, or a substituted or unsubstituted heteroarene having 5 to 30 ring atoms.

In the above formula (B): $Ar^{2A}$ represents a substituted or unsubstituted aryl group having 6 to 30 ring atoms, or a substituted or unsubstituted heteroaryl group having 5 to 30 ring atoms, and $R^{2A}$ represents a hydrogen atom or a monovalent organic group having 1 to 20 carbon atoms, or $Ar^{2A}$ and $R^{2A}$ taken together represent a ring structure having 3 to 20 ring atoms together with the carbon atom to which $Ar^{2A}$ and $R^{2A}$ bond; and $R^X$ represents a hydrogen atom or a monovalent organic group having 1 to 20 carbon atoms.

The substituted or unsubstituted arene having 6 to 30 ring atoms, or the substituted or unsubstituted heteroarene having 5 to 30 ring atoms which may be represented by $Ar^{1A}$ is exemplified by compounds similar to the compounds exemplified as the substituted or unsubstituted arene having 6 to 30 ring atoms, or the substituted or unsubstituted heteroarene having 5 to 30 ring atoms that gives $Ar^1$, and the like.

The substituted or unsubstituted aryl group having 6 to 30 ring atoms, or the substituted or unsubstituted heteroaryl group having 5 to 30 ring atoms which may be represented by $Ar^{2A}$ is exemplified by groups similar to the substituted or unsubstituted aryl groups having 6 to 30 ring atoms, or the substituted or unsubstituted heteroaryl groups having 5 to 30 ring atoms exemplified as $Ar^2$ in the above formula (1), and the like.

The monovalent organic group having 1 to 20 carbon atoms which may be represented by $R^{2A}$ is exemplified by groups similar to the monovalent organic groups having 1 to 20 carbon atoms exemplified as $R^2$ in the above formula (1), and the like.

The ring structure having 3 to 20 ring atoms, a part of which may be represented by $Ar^{2A}$ and $R^{2A}$ taken together, is exemplified by structures similar to the ring structures having 3 to 20 ring atoms exemplified as the ring structure, a part of which may be represented by $Ar^2$ and $R^2$ taken together, in the above formula (1), and the like.

The monovalent organic group having 1 to 20 carbon atoms which may be represented by $R^X$ is exemplified by groups similar to the monovalent organic groups having 1 to 20 carbon atoms exemplified as $R^2$ in the above formula (1), and the like.

$R^X$ represents preferably a hydrogen atom.

As reaction conditions for the condensation reaction, conventionally well-known conditions of condensation reactions carried out in the presence of an acid catalyst may be employed.

The acid catalyst may be any of a protonic acid, a Broensted acid, and a Lewis acid. Examples of the acid catalyst include: inorganic acids such as sulfuric acid, phosphoric acid, and perchloric acid; organic acids, e.g., organic sulfonic acids such as p-toluenesulfonic acid, and carboxylic acids such as formic acid, acetic acid, and oxalic acid; and the like.

The lower limit of an amount of the acid catalyst to be used with respect to 100 parts by mass of a total amount of the compound (a) and the compound (b) is preferably 0.01 parts by mass, more preferably 0.1 parts by mass, still more preferably 1 part by mass, and particularly preferably 10 parts by mass. The upper limit of the amount is preferably 1,000 parts by mass, more preferably 500 parts by mass, still more preferably 200 parts by mass, and particularly preferably 100 parts by mass.

The lower limit of a reaction temperature in the condensation reaction is preferably 40° C., more preferably 50° C., still more preferably 60° C., and particularly preferably 70° C. The upper limit of the reaction temperature is preferably 200° C., more preferably 150° C., still more preferably 130° C., and particularly preferably 100° C.

The lower limit of a reaction time period in the condensation reaction is preferably 5 min, more preferably 30 min, still more preferably 1 hour, and particularly preferably 2 hrs. The upper limit of the reaction time period is preferably 100 hrs, more preferably 50 hrs, still more preferably 24 hrs, and particularly preferably 12 hrs.

A reaction solvent for use in the condensation reaction is exemplified by solvents similar to the solvents exemplified as the solvent (B) described below, and the like. Of these: ether solvents are preferred; cyclic ether solvents are more preferred; and 1,4-dioxane is still more preferred.

In the case in which $R^X$ in the above formula (B) represents a hydrogen atom, the compound (A) wherein $R^3$ in the above formula (1) represents an unsubstituted ethenediyl group or an ethynediyl group is produced by the condensation reaction.

A reaction mixture of the condensation reaction is appropriately subjected to a treatment by a well-known method, so that the compound (A) can be isolated by performing purification such as distillation or recrystallization.

(B) Solvent

The solvent (B) is not particularly limited as long as it is capable of dissolving or dispersing the compound (A), and optional component(s) which may be contained as needed.

The solvent (B) is exemplified by an alcohol solvent, a ketone solvent, an ether solvent, an ester solvent, a nitrogen-containing solvent, and the like. The solvent (B) may be used either alone of one type, or in a combination of two or more types thereof.

Examples of the alcohol solvent include: monohydric alcohol solvents such as methanol, ethanol, and n-propanol; polyhydric alcohol solvents such as ethylene glycol and 1,2-propylene glycol; and the like.

Examples of the ketone solvent include: chain ketone solvents such as methyl ethyl ketone and methyl isobutyl ketone; cyclic ketone solvents such as cyclohexanone; and the like.

Examples of the ether solvent include:

polyhydric alcohol ether solvents, e.g., chain ether solvents such as n-butyl ether, and cyclic ether solvents such as tetrahydrofuran and 1,4-dioxane;

polyhydric alcohol partial ether solvents such as diethylene glycol monomethyl ether; and the like.

Examples of the ester solvent include: carbonate solvents such as diethyl carbonate; mono ester acetate solvents such as methyl acetate and ethyl acetate; lactone solvents such as γ-butyrolactone; polyhydric alcohol partial ether carboxylate solvents such as diethylene glycol monomethyl ether acetate and propylene glycol monomethyl ether acetate; ester lactate solvents such as methyl lactate and ethyl lactate; and the like.

Examples of the nitrogen-containing solvent include: chain nitrogen-containing solvents such as N,N-dimethylacetamide; cyclic nitrogen-containing solvents such as N-methylpyrrolidone; and the like.

The solvent (B) is preferably the ketone solvent, more preferably the cyclic ketone solvent, and still more preferably cyclohexanone.

Optional Component(s)

The composition (I) may contain, as optional component (s), an acid generating agent, a crosslinking agent, a surfactant, an adhesion aid, and the like. The optional component (s) may be used either alone of one type, or in a combination of two or more types thereof Acid Generating Agent The acid generating agent is a component that generates an acid by an action of heat and/or light to promote crosslinking of the compound (A). When the composition (I) contains the acid generating agent, a crosslinking reaction of the compound (A) is promoted, thereby enabling further increase in hardness of the resist underlayer film to be formed, and enabling the heat resistance of the resist underlayer film to be further improved.

The acid generating agent is exemplified by an onium salt compound, an N-sulfonyloxyimide compound, and the like.

Crosslinking Agent

The crosslinking agent is a component that forms crosslinking bonds between components such as the compound (A) in the composition (I), or forms cross-linked structures by its own molecules, through an action of heat and/or an acid. In a case in which the composition (I) contains the crosslinking agent, the hardness of the resist underlayer film to be formed can be increased, and the heat resistance of the resist underlayer film can be further improved.

The crosslinking agent is exemplified by a polyfunctional (meth)acrylate compound, an epoxy compound, a hydroxymethyl group-substituted phenol compound, an alkoxyalkyl group-containing phenol compound, a compound having an alkoxyalkylated amino group, and the like.

Composition (II)

The composition (II) contains the condensation reaction product (A') and the solvent (B). The composition (II) may also contain the optional component(s) within a range not leading to impairment of the effects of the present invention.

Each component will be described below.

(A') Condensation Reaction Product

The condensation reaction product (A') is a product of an acid-catalyzed condensation reaction of a compound represented by the following formula (A) (compound (a)) and a compound represented by the following formula (B) (compound (b)).

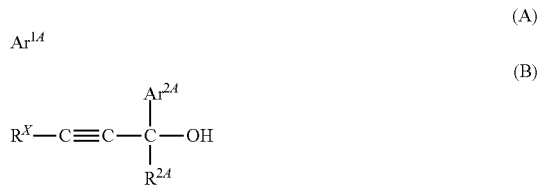

In the above formula (A), $Ar^{1A}$ represents a substituted or unsubstituted arene having 6 to 30 ring atoms, or a substituted or unsubstituted heteroarene having 5 to 30 ring atoms.

In the above formula (B), $Ar^{2A}$ represents a substituted or unsubstituted aryl group having 6 to 30 ring atoms, or a substituted or unsubstituted heteroaryl group having 5 to 30 ring atoms, and $R^{2A}$ represents a hydrogen atom or a monovalent organic group having 1 to 20 carbon atoms, or $Ar^{2A}$ and $R^{2A}$ taken together represent a ring structure having 3 to 20 ring atoms together with the carbon atom to which $Ar^{2A}$ and $R^{2A}$ bond; and $R^X$ represents a hydrogen atom or a monovalent organic group having 1 to 20 carbon atoms.

The condensation reaction product (A') can be produced as a product of a condensation reaction by a compound-producing method including a step of allowing a condensation reaction of the compound (a) and the compound (b) in the presence of an acid catalyst, as described in the section of "Compound-Producing Method" above.

The solvent (B) and the optional component(s) in the composition (II) are similar to the solvent (B) and the optional component(s) in the composition (I) described above.

Preparation Procedure of Composition

The composition of one embodiment of the present invention may be prepared, for example, by mixing the compound (A) or the condensation reaction product (A'), the solvent (B), and as needed, the optional component(s) in a certain ratio, preferably followed by filtering a thus resulting mixture through a membrane filter, etc. having a pore size of no greater than 0.1 μm. The lower limit of a solid content concentration of the composition is preferably 0.1% by mass, more preferably 1% by mass, still more preferably 3% by mass, and particularly preferably 5% by mass. The upper limit of the solid content concentration is preferably 50% by mass, more preferably 30% by mass, still more preferably 20% by mass, and particularly preferably 15% by mass. The solid content concentration was determined by: baking 0.5 g of the composition at 250° C. for 30 min; and measuring the mass of the solid content for 0.5 g of the composition.

Resist Underlayer Film

The resist underlayer film of the embodiment of the present invention is formed from the composition of the one embodiment of the present invention (the composition (I) or the composition (II)). Since the resist underlayer film is formed from the composition described above, the resist underlayer film is superior in etching resistance, heat resistance, flatness and the inhibitory ability of film defects.

Resist Underlayer Film-Forming Method

The resist underlayer film-forming method of the embodiment of the present invention includes a step of applying the composition of the embodiment of the present invention directly or indirectly on a substrate (hereinafter, may be also referred to as "applying step").

Since the composition described above is used in the resist underlayer film-forming method, a resist underlayer film that is superior in etching resistance, heat resistance, flatness and the inhibitory ability of film defects can be formed. Each step will be described below.

Applying Step

In this step, the composition of the one embodiment of the present invention is applied directly or indirectly on a substrate.

Examples of the substrate include a silicon wafer, a wafer coated with aluminum, and the like. The applying procedure of the composition is not particularly limited, and for example, an appropriate procedure such as spin coating, cast coating or roll coating may be employed to enable forming of a coating film.

The coating film may be subjected to heating. The heating of the coating film is typically carried out in an ambient air, but may be carried out in a nitrogen atmosphere. The lower limit of a temperature in the heating is preferably 200° C., more preferably 250° C., and still more preferably 300° C. The upper limit of the temperature is preferably 600° C., more preferably 500° C., and still more preferably 400° C. The lower limit of a time period of the heating is preferably 15 sec, and more preferably 30 sec. The upper limit of the time period is preferably 1,200 sec, and more preferably 600 sec.

Prior to the heating of the coating film, preheating may be conducted at a temperature of no less than 60° C. and no greater than 150° C. The lower limit of a time period of the preheating is preferably 10 sec, and more preferably 30 sec. The upper limit of the time period is preferably 300 sec, and more preferably 180 sec.

In the manner described above, the resist underlayer film can be formed.

It is to be noted that the resist underlayer film is formed by heating the coating film according to the resist underlayer film-forming method of the embodiment of the present invention; however, provided that the composition contains the acid generating agent and that the acid generating agent is a radiation-sensitive acid generating agent, it is also possible to form the resist underlayer film by hardening the coating film through a combination of an exposure and heating. The radioactive ray used for the exposure may be appropriately selected from: electromagnetic waves such as visible rays, ultraviolet rays, far ultraviolet rays, X-rays and γ-rays; and particle rays such as electron beams, molecular beams and ion beams in accordance with the type of the acid generating agent.

The lower limit of an average thickness of the resist underlayer film to be formed is preferably 30 nm, more preferably 50 nm, and still more preferably 100 nm. The upper limit of the average thickness is preferably 3,000 nm, more preferably 2,000 nm, and still more preferably 500 nm.

Pattern-Forming Method

The pattern-forming method includes: a step of applying directly or indirectly on a substrate the composition of the one embodiment of the present invention, to form a resist underlayer film (hereinafter, may be also referred to as "resist underlayer film-forming composition-applying step"); a step of applying a composition for forming a resist film directly or indirectly on the resist underlayer film to form a resist film (hereinafter, may be also referred to as "resist film-forming composition-applying step"); a step of exposing the resist film to a radioactive ray (hereinafter, may be also referred to as "exposing step"); and a step of developing the resist film exposed (hereinafter, may be also referred to as "developing step").

The pattern-forming method may further include, after the developing step, a step of carrying out etching using as a mask, a resist pattern formed by the developing step (hereinafter, may be also referred to as "etching step").

According to the pattern-forming method, use of the aforementioned resist underlayer film, which is superior in etching resistance, heat resistance, flatness, and inhibitory ability of film defects, enables a pattern having a favorable shape to be obtained.

Prior to the resist film-forming composition-applying step, the pattern-forming method may also include, as needed, a step of forming a silicon-containing film directly or indirectly on the resist underlayer film formed by the resist underlayer film-forming composition-applying step (hereinafter, may be also referred to as "silicon-containing film-forming step"). Hereinafter, each step will be described.

Resist Underlayer Film-Forming Composition-Applying Step

In this step, the composition of the one embodiment of the present invention is applied directly or indirectly on a substrate to form a resist underlayer film. This step is similar to the applying step in the resist underlayer film-forming method described above.

Silicon-Containing Film-Forming Step

In this step, a silicon-containing film is formed directly or indirectly on the resist underlayer film formed by the resist underlayer film-forming composition-applying step.

The silicon-containing film is formed by, for example: applying a composition for silicon-containing film formation directly or indirectly on the resist underlayer film to form a coating film; and hardening the coating film typically by subjecting the coating film to an exposure and/or heating. As a commercially available product of the composition for silicon-containing film formation, for example, "NFC SOG01", "NFC SOG04", or "NFC SOG080", each available from JSR Corporation, or the like may be used.

Examples of the radioactive ray for use in the exposure include: electromagnetic waves such as visible rays, ultraviolet rays, far ultraviolet rays, X-rays and γ-rays; particle rays such as electron beams, molecular beams and ion beams; and the like.

The lower limit of a temperature for heating the coating film is preferably 90° C., more preferably 150° C., and still more preferably 180° C. The upper limit of the temperature is preferably 550° C., more preferably 450° C., and still more preferably 300° C. The lower limit of an average thickness of the silicon-containing film to be formed is preferably 1 nm, more preferably 10 nm, and still more preferably 20 nm. The upper limit of the average thickness is preferably 20,000 nm, more preferably 1,000 nm, and still more preferably 100 nm.

In this manner, the silicon-containing film is formed. Furthermore, it is preferred that the silicon-containing film thus obtained is heated (baked), for example, at a temperature of no less than 350° C. and no greater than 550° C. for a time period of no less than 5 sec and no greater than 600 sec.

Resist Film-Forming Composition-Applying Step

In this step, a composition for forming a resist film is applied directly or indirectly on the resist underlayer film formed by the resist underlayer film-forming composition-applying step. In the case of the silicon-containing film-forming step having been carried out, the composition for forming a resist film is applied directly or indirectly on the silicon-containing film.

In this step, specifically, the resist film is formed by applying the composition for forming a resist film such that a resultant resist film has a predetermined thickness, and thereafter subjecting the resist composition to prebaking to evaporate away the solvent in the coating film.

Examples of the composition for forming a resist film include a chemically amplified positive or negative resist composition that contains a radiation-sensitive acid generating agent; a positive resist composition containing an alkali-soluble resin and a quinone diazide-based photosensitizing agent; a negative resist composition containing an alkali-soluble resin and a crosslinking agent; and the like.

The lower limit of a solid content concentration of the composition for forming a resist film is preferably 0.3% by mass, and more preferably 1% by mass. The upper limit of the solid content concentration is preferably 50% by mass, and more preferably 30% by mass. typically, the composition for forming a resist film is filtered through a filter having a pore size of, for example, no greater than 0.2 µm, and then employed for formation of the resist film. It is to be noted that in this step, a commercially available resist composition may be used directly.

A procedure for applying the composition for forming a resist film is not particularly limit, and is exemplified by a spin-coating procedure and the like. Furthermore, a temperature of the prebaking may be appropriately adjusted depending on the type of the resist composition used. The lower limit of the temperature of the prebaking is preferably 30° C., and more preferably 50° C. The upper limit of the temperature is preferably 200° C., and more preferably 150° C. The lower limit of a time period of the prebaking is preferably 10 sec, and more preferably 30 sec. The upper limit of the time period is preferably 600 sec, and more preferably 300 sec.

Exposing Step

In this step, the resist film formed by the resist film-forming composition-applying step is exposed to a radioactive ray.

The radioactive ray for use in the exposure may be appropriately selected from: electromagnetic waves such as visible rays, ultraviolet rays, far ultraviolet rays, X-rays and γ-rays; and particle rays such as electron beams, molecular beams and ion beams in accordance with the type of the radiation-sensitive acid generating agent to be used in the composition for forming a resist film. Among these, far ultraviolet rays are preferred, a KrF excimer laser beam (wavelength: 248 nm), an ArF excimer laser beam (wavelength: 193 nm), an $F_2$ excimer laser beam (wavelength: 157 nm), a $Kr_2$ excimer laser beam (wavelength: 147 nm), an ArKr excimer laser beam (wavelength: 134 nm), or an extreme ultraviolet ray (EUV; wavelength: 13.5 nm, etc.) is more preferred, and a KrF excimer laser beam, an ArF excimer laser beam, or EUV is still more preferred.

Post-baking may be carried out after the exposure for the purpose of improving resolution, pattern profile, developability, and the like. A temperature of the post-baking may be appropriately adjusted depending on, e.g., the type of the resist composition used. The lower limit of the temperature of the prebaking is preferably 50° C., and more preferably 70° C. The upper limit of the temperature is preferably 200° C., and more preferably 150° C. The lower limit of a time period of the post-baking is preferably 10 sec, and more preferably 30 sec. The upper limit of the time period is preferably 600 sec, and more preferably 300 sec.

Developing Step

In this step, the resist film exposed is developed. The development may be either a development with an alkali or a development with an organic solvent. In the case of the development with an alkali, examples of the developer solution include basic aqueous solutions of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethyl ammonium hydroxide (TMAH), tetraethyl ammonium hydroxide, pyrrole, piperidine, choline, 1,8-diazabicyclo[5.4.0]-7-undecene, 1,5-diazabicyclo[4.3.0]-5-nonene, or the like. To the basic aqueous solution, a water-soluble organic solvent, for example, alcohols such as methanol and ethanol, a surfactant, etc., may be added, each in an appropriate amount. Alternatively, in the case of the development with an organic solvent, examples of the developer solution include various organic solvents exemplified as the solvent (B) of the composition described above, and the like.

A predetermined resist pattern is formed by the development with the developer solution, followed by washing and drying.

Etching Step

In this step, etching is carried out with the resist pattern, which was formed by the developing step, as a mask to form a pattern on the substrate. The etching may be conducted once or multiple times. In other words, the etching may be conducted sequentially with patterns obtained by the etching as masks, and in light of obtaining a pattern having a more favorable shape, the etching is preferably conducted multiple times. In the case in which the etching is conducted multiple times, the silicon-containing film, the resist underlayer film, and the substrate are subjected to the etching sequentially in this order. An etching procedure may be exemplified by dry etching, wet etching, and the like. Of these, in light of making the shape of the substrate pattern more favorable, the dry etching is preferred. In the dry etching, for example, gas plasma such as oxygen plasma, or the like may be used. After the etching, the substrate having a predetermined pattern can be obtained.

EXAMPLES

Hereinafter, the embodiment of the present invention will be explained in more detail by way of Examples, but the present invention is not in any way limited to these Examples. Measuring methods for various types of physical properties are shown below.

Average Molecular Weight

An average molecular weight (weight average molecular weight (Mw)) of the compound was determined by gel permeation chromatography (detector: differential refractometer) using GPC columns available from Tosoh Corporation ("G2000 HXL"×2 and "G3000 HXL"×1), under analytical conditions involving a flow rate of 1.0 mL/min, an elution solvent of tetrahydrofuran, and a column temperature of 40° C., with mono-dispersed polystyrene as a standard.

Average Thickness of Resist Underlayer Film

The average thickness of the resist underlayer film was measured by using a spectroscopic ellipsometer ("M2000D" available from J. A. WOOLLAM Co.).

Synthesis of Compound (A)

As the compound (A), polymers (hereinafter, may be also referred to as "compounds (A-1) to (A-10)") each having, as a repeating unit, a partial structure represented by the following formulae (A-1) to (A-10) were synthesized in accordance with the following procedure.

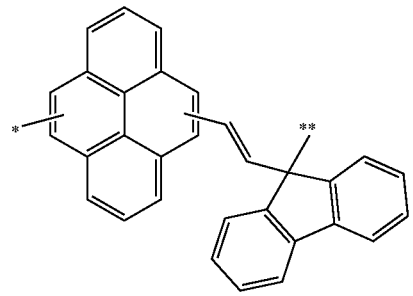

(A-1)

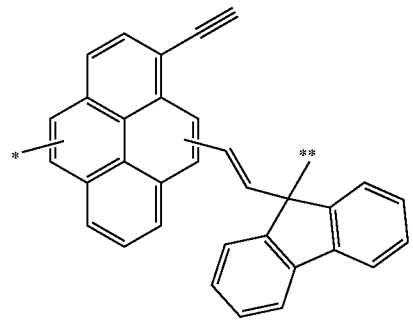

(A-2)

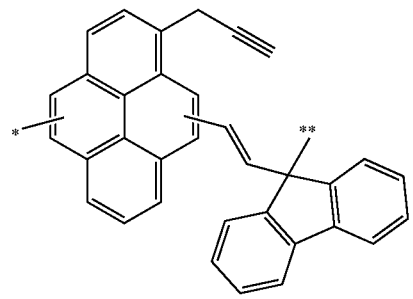

(A-3)

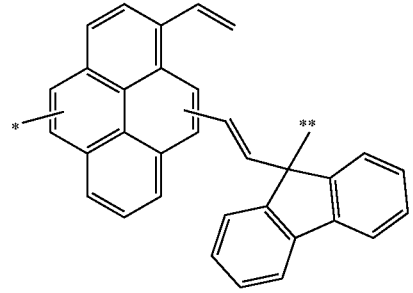

(A-4)

(A-5) 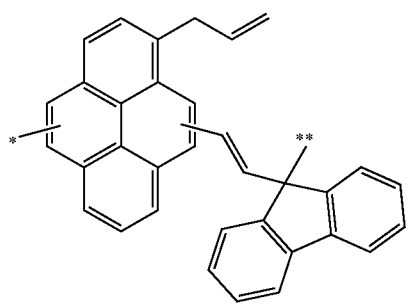

(A-6) 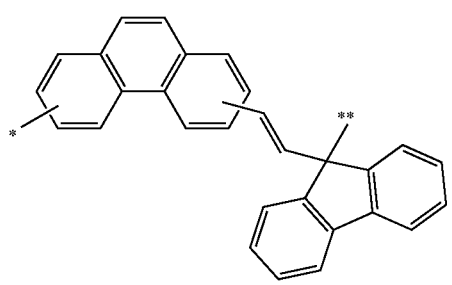

(A-7) 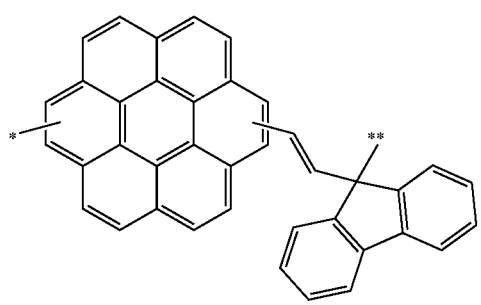

(A-8) 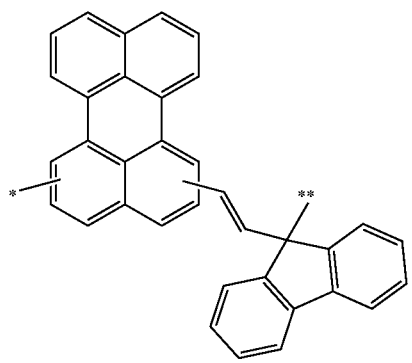

(A-9) 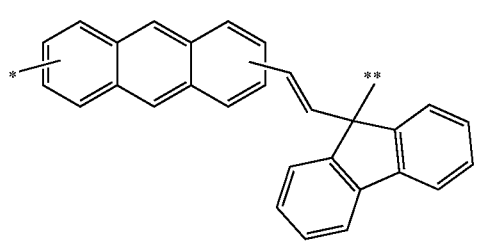

(A-10) 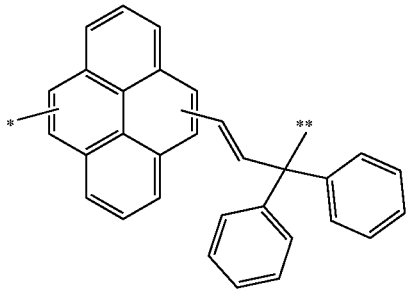

Example 1-1

The compound (A-1) was obtained by: adding, in a nitrogen atmosphere, 20.0 g of pyrene, 37.6 g of p-toluenesulfonic acid monohydrate, 40.8 g of 9-ethynyl-9-fluorenol, and 220.36 g of 1,4-dioxane; and allowing for a reaction at 80° C. for 3 hrs. The weight average molecular weight (Mw) of the compound (A-1) thus obtained was 2,800.

Example 1-2

In a similar manner to Example 1-1, the compound (A-2) was obtained. The weight average molecular weight (Mw) of the compound (A-2) thus obtained was 2,500.

Example 1-3

In a similar manner to Example 1-1, the compound (A-3) was obtained. The weight average molecular weight (Mw) of the compound (A-3) thus obtained was 2,400.

Example 1-4

In a similar manner to Example 1-1, the compound (A-4) was obtained. The weight average molecular weight (Mw) of the compound (A-4) thus obtained was 2,300.

Example 1-5

In a similar manner to Example 1-1, the compound (A-5) was obtained. The weight average molecular weight (Mw) of the compound (A-5) thus obtained was 2,400.

Example 1-6

In a similar manner to Example 1-1, the compound (A-6) was obtained. The weight average molecular weight (Mw) of the compound (A-6) thus obtained was 2,100.

Example 1-7

In a similar manner to Example 1-1, the compound (A-7) was obtained. The weight average molecular weight (Mw) of the compound (A-7) thus obtained was 1,800.

Example 1-8

In a similar manner to Example 1-1, the compound (A-8) was obtained. The weight average molecular weight (Mw) of the compound (A-8) thus obtained was 2,000.

Example 1-9

In a similar manner to Example 1-1, the compound (A-9) was obtained. The weight average molecular weight (Mw) of the compound (A-9) thus obtained was 2,200.

Example 1-10

In a similar manner to Example 1-1, the compound (A-10) was obtained. The weight average molecular weight (Mw) of the compound (A-10) thus obtained was 1,500.

Synthesis Example 1-1

Into a reaction vessel, 250.0 g of p-cresol, 125.0 g of 37% by mass formalin, and 2 g of anhydrous oxalic acid were added in a nitrogen atmosphere, and a reaction was allowed at 100° C. for 3 hrs and further at 180° C. for 1 hour. Subsequently, an unreacted monomer was eliminated under reduced pressure to give a resin represented by the following formula (a-1). The weight average molecular weight (Mw) of the resin (a-1) thus obtained was 11,000.

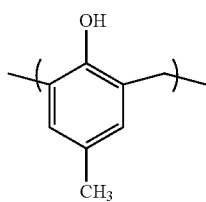

(a-1)

Preparation of Composition for Forming a Resist Underlayer Film

The compound (A), the solvent (B), (C) acid generating agent, and (D) crosslinking agent used in preparation of the compositions for forming resist underlayer films are as presented below.

(A) Compound
Examples: the compounds (A-1) to (A-10) synthesized as described above
Comparative Example: the resin (a-1) synthesized as described above
(B) Solvent
B-1: cyclohexanone (C) Acid Generating Agent
C-1: bis(4-t-butylphenyl)iodonium nonafluoro-n-butane-sulfonate (a compound represented by the following formula (C-1))

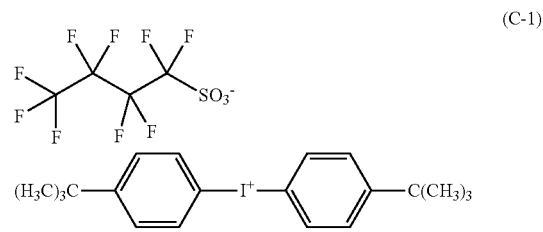

(C-1)

(D) Crosslinking Agent
D-1: 1,3,4,6-tetrakis(methoxymethyl)glycoluril (a compound represented by the following formula (D-1))

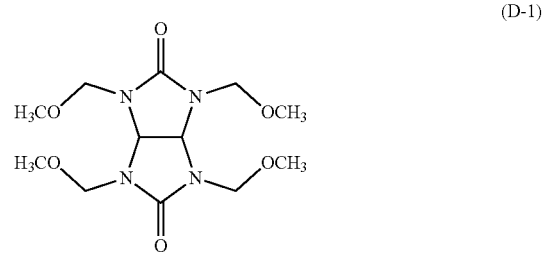 [SMILES: COCN1C(=O)N(COC)C2C1N(COC)C(=O)N2COC]

(D-1)

Example 2-1

Ten parts by mass of (A-1) as the compound (A) were dissolved in 90 parts by mass of (B-1) as the solvent (B). A solution thus obtained was filtered through a membrane filter having a pore size of 0.1 μm to prepare a composition for forming a resist underlayer film (J-1).

Examples 2-2 to 2-12 and Comparative Example 2-1

Compositions for forming resist underlayer films (J-2) to (J-12) and (CJ-1) were prepared by a similar operation to that of Example 2-1 except that for each component, the type and content shown in Table 1 were used. In Table 1, "-" indicates that a corresponding component was not used.

TABLE 1

| | Composition for forming resist underlayer film | (A) Compound type | content (parts by mass) | (B) Solvent type | content (parts by mass) | (C) Acid generating agent type | content (parts by mass) | (D) Crosslinking agent type | content (parts by mass) |
|---|---|---|---|---|---|---|---|---|---|
| Example 2-1 | J-1 | A-1 | 10 | B-1 | 90 | — | — | — | — |
| Example 2-2 | J-2 | A-2 | 10 | B-1 | 90 | — | — | — | — |
| Example 2-3 | J-3 | A-3 | 10 | B-1 | 90 | — | — | — | — |
| Example 2-4 | J-4 | A-4 | 10 | B-1 | 90 | — | — | — | — |
| Example 2-5 | J-5 | A-5 | 10 | B-1 | 90 | — | — | — | — |
| Example 2-6 | J-6 | A-6 | 10 | B-1 | 90 | — | — | — | — |
| Example 2-7 | J-7 | A-7 | 10 | B-1 | 90 | — | — | — | — |
| Example 2-8 | J-8 | A-8 | 10 | B-1 | 90 | — | — | — | — |
| Example 2-9 | J-9 | A-9 | 10 | B-1 | 90 | — | — | — | — |
| Example 2-10 | J-10 | A-10 | 10 | B-1 | 90 | — | — | — | — |

TABLE 1-continued

|  | Composition for forming resist underlayer film | (A) Compound | | (B) Solvent | | (C) Acid generating agent | | (D) Crosslinking agent | |
|---|---|---|---|---|---|---|---|---|---|
|  |  | type | content (parts by mass) | type | content (parts by mass) | type | content (parts by mass) | type | content (parts by mass) |
| Example 2-11 | J-11 | A-1 | 10 | B-1 | 90 | C-1 | 0.5 | D-1 | 1 |
| Example 2-12 | J-12 | A-1 | 10 | B-1 | 90 | C-1 | 0.5 | D-2 | 1 |
| Comparative Example 2-1 | CJ-1 | a-1 | 10 | B-1 | 90 | — | — | — | — |

Formation of Resist Underlayer Film

Examples 3-1 to 3-12 and Comparative Example 3-1

Each composition for forming a resist underlayer film prepared as described above was applied on a silicon wafer (substrate) with a spin coater ("CLEAN TRACK ACT12" available from Tokyo Electron Limited) by way of a spin-coating procedure. Next, heating (baking) in an ambient air atmosphere at the heating temperature (° C.) for the heating time period (sec) shown in Table 2 below was followed by cooling at 23° C. for 60 sec to form a resist underlayer film having an average thickness of 200 nm. Accordingly, a resist underlayer film-attached substrate having been provided with the resist underlayer film thereon was obtained.

Evaluations

By using the compositions for forming the resist underlayer films and the resist underlayer film-attached substrates, each obtained as described above, etching resistance, heat resistance, flatness, and inhibitory ability of film defects were evaluated according to the following procedures. The results of the evaluations are shown together in Table 2 below.

Etching Resistance

The resist underlayer film of the resist underlayer film-attached substrate obtained as described above was treated in an etching apparatus ("TACTRAS" available from Tokyo Electron Limited) under conditions involving: $CF_4/Ar=110/440$ sccm, PRESS.=30 MT, HF RF (radiofrequency power for plasma production)=500 W, LF RF (radiofrequency power for bias)=3,000 W, DCS=−150 V, RDC (flow rate percentage at gas center)=50%, and 30 sec. An etching rate (nm/min) was calculated based on the average thickness of the resist underlayer film before the treatment and the average thickness of the resist underlayer film after the treatment, and a ratio with respect to Comparative Example 3-1 was determined as a marker for etching resistance evaluation. The etching resistance was evaluated to be: "A" (favorable) in a case in which the ratio was less than 1.00; and "B" (unfavorable) in a case in which the ratio was no less than 1.00. In Table 2, "-" in the column of the etching resistance indicates being a standard for the evaluation.

Heat Resistance

The composition for forming a resist underlayer film prepared as described above was applied on a silicon wafer having a diameter of 8 inches by a spin coating procedure and baked in an ambient air atmosphere at 250° C. for 60 sec to form a resist underlayer film, whereby a resist underlayer film-attached substrate was obtained. Next, the resist underlayer film of this resist underlayer film-attached substrate was scraped to collect a powder, and the powder of the resist underlayer film was placed into a container used for measurement by a TG-DTA apparatus ("TG-DTA 2000SR", available from NETZSCH), and a mass of the powder prior to heating was measured. The powder was then heated to 400° C. in the TG-DTA apparatus in a nitrogen atmosphere with a rate of temperature rise of 10° C./min, and the mass of the powder at 400° C. was measured. The mass loss rate (%) was obtained by the following equation and defined as a marker of heat resistance.

$$M_L = \{(m1-m2)/m1\} \times 100$$

In the above equation, $M_L$ represents the mass loss rate (%); m1 represents the mass prior to heating (mg); and m2 represents the mass at 400° C. (mg).

A lower mass loss rate of the powder used as the sample indicates that the heat resistance is more favorable, due to less generation of sublimated matter and resist underlayer film degradation products during the heating of the resist underlayer film. In other words, the lower mass loss rate indicates higher heat resistance. The heat resistance was evaluated to be: "A" (extremely favorable) in a case in which the mass loss rate was less than 5%; "B" (favorable) in a case in which the mass loss rate was no less than 5% and less than 10%; and "C" (unfavorable) in a case in which the mass loss rate was no less than 10%.

Flatness

Each of the compositions for forming resist underlayer films prepared as described above was applied by a spin-coating procedure using a spin coater ("CLEAN TRACK ACT-12" available from Tokyo Electron Limited), on a silicon substrate 1 provided with a trench pattern having a depth of 100 nm and a groove width of 10 μm formed thereon, as shown in the FIGURE. A rotational speed for the spin coating was the same as that in the case of forming the film having the average thickness of 200 nm in "Formation of Resist Underlayer Film" described above. Subsequently, by heating (baking) in an ambient air atmosphere at a heating temperature (° C.) for a heating time period (sec) shown in Table 2 below, a film 2 was formed having an average thickness of 200 nm at parts having no trench provided. Accordingly, a film-attached silicon substrate, the silicon substrate being covered by the film, was obtained.

A cross-sectional shape of the film-attached silicon substrate was observed by using a scanning electron microscope ("S-4800" available from Hitachi High-Technologies Corporation), and the difference (ΔFT) between a height at a center portion "b" of the trench pattern of the film and a height at a position "a" 5 μm away from the edge of the trench pattern, at which no trench pattern was provided, was defined as a marker of the flatness. The flatness was evaluated to be: "A" (favorable) in a case of ΔFT being less than 40 nm; "B" (somewhat favorable) in a case of ΔFT being no less than 40 nm and less than 60 nm; and "C" (unfavorable)

in a case of ΔFT being no less than 60 nm. It is to be noted that the difference in heights shown in the FIGURE is exaggerated.

Inhibitory Ability of Film Defects

On the resist underlayer film-attached substrate obtained as described above, a composition for silicon-containing film formation ("NFC SOG080" available from JSR Corporation) was applied by a spin-coating procedure and then heated (baked) at 200° C. for 60 sec in an ambient air atmosphere to form a silicon-containing film having an average thickness of 50 nm, thereby giving a substrate provided with a silicon-containing film. After the substrate provided with the silicon-containing film thus obtained was further heated (baked) at 450° C. for 60 sec, the surface of the silicon-containing film was observed with an optical microscope. The inhibitory ability of film defects was evaluated to be: "A" (favorable) in a case in which cracking or peeling of the silicon-containing film was not found; and "B" (unfavorable) in a case in which cracking or peeling of the silicon-containing film was found.

TABLE 2

|  | Composition for forming resist underlayer film | Heating temperature/ heating time in resist underlayer film formation (° C./sec) | Etching resistance | Heat resistance | Flatness | Inhibitory ability of film defects |
|---|---|---|---|---|---|---|
| Example 3-1 | J-1 | 350/60 | A | B | A | A |
| Example 3-2 | J-2 | 350/60 | A | A | A | A |
| Example 3-3 | J-3 | 350/60 | A | A | A | A |
| Example 3-4 | J-4 | 350/60 | A | A | A | A |
| Example 3-5 | J-5 | 350/60 | A | A | A | A |
| Example 3-6 | J-6 | 350/60 | A | B | A | A |
| Example 3-7 | J-7 | 350/60 | A | B | A | A |
| Example 3-8 | J-8 | 350/60 | A | B | A | A |
| Example 3-9 | J-9 | 350/60 | A | B | A | A |
| Example 3-10 | J-10 | 350/60 | A | B | A | A |
| Example 3-11 | J-11 | 350/60 | A | A | A | A |
| Example 3-12 | J-12 | 350/60 | A | A | A | A |
| Comparative Example 3-1 | CJ-1 | 350/60 | — | C | C | B |

As is seen from the results shown in Table 2, the resist underlayer films formed from the compositions for forming resist underlayer films of the Examples were superior in the etching resistance, the heat resistance, the flatness, and the inhibitory ability of film defects. To the contrary, in the case of the resist underlayer film formed from the composition for forming a resist underlayer film of the Comparative Example, the heat resistance, the flatness, and the inhibitory ability of film defects were all unfavorable, with the etching resistance being inferior.

The composition for forming a resist underlayer film of the one embodiment of the present invention enables a resist underlayer film superior in etching resistance, heat resistance, flatness, and inhibitory ability of film defects to be formed. The resist underlayer film of the embodiment of the present invention is superior in etching resistance, heat resistance, flatness, and inhibitory ability of film defects. The resist underlayer film-forming method of the embodiment of the present invention enables a resist underlayer film superior in etching resistance, heat resistance, flatness, and inhibitory ability of film defects to be formed. The pattern-forming method of the embodiment of the present invention enables a pattern having a favorable shape to be obtained by using such a superior resist underlayer film. The compound of the embodiment of the present invention can be suitably used as a component of the composition for forming a resist underlayer film of the embodiment of the present invention. The compound-producing method of the embodiment of the present invention enables the compound of the embodiment of the present invention to be produced. Therefore, these can be suitably used for manufacture of semiconductor devices and the like, for which microfabrication is expected to progress further hereafter.

Obviously, numerous modifications and variations of the present invention are possible in light of the above teachings. It is therefore to be understood that within the scope of the appended claims, the invention may be practiced otherwise than as specifically described herein.

What is claimed is:

1. A composition which enables a resist underlayer film to be formed, the composition comprising:
   a product of an acid-catalyzed condensation reaction of a compound represented by formula (A) and a compound represented by formula (B); and
   a solvent, $$Ar^{1A} \quad (A)$$

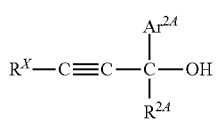

(B)

wherein,
in the formula (A), $Ar^{1A}$ represents an arene having 6 to 30 ring atoms, or a heteroarene having 5 to 30 ring atoms, wherein the arene having 6 to 30 ring atoms and the heteroarene having 5 to 30 ring atoms are each unsubstituted or substituted with a group which does not contain an oxygen atom, and the arene having 6 to 30 ring atoms is anthracene, phenanthrene, tetracene, pyrene, pentacene, coronene, perylene, biphenyl, dimethylbiphenyl, diphenylbiphenyl, fluorene, or 9,9-diphenylfluorene, and
in the formula (B), $Ar^{2A}$ represents a substituted or unsubstituted aryl group having 6 to 30 ring atoms, or a substituted or unsubstituted heteroaryl group having 5 to 30 ring atoms, and $R^{2A}$ represents a hydrogen atom or a monovalent organic group having 1 to 20 carbon atoms, or $Ar^{2A}$ and $R^{2A}$ taken together represent a ring structure having 3 to 20 ring atoms together with the carbon atom to which $Ar^{2A}$ and $R^{2A}$ bond; and $R^X$ presents a hydrogen atom or a monovalent organic group having 1 to 20 carbon atoms.

2. A pattern-forming method comprising:
applying the composition according to claim 1 directly or indirectly on a substrate to form a resist underlayer film;
applying a composition for forming a resist film directly or indirectly on the resist underlayer film to form a resist film;
exposing the resist film to a radioactive ray; and
developing the resist film exposed.

3. The pattern-forming method according to claim 2, further comprising before the applying of the composition for forming a resist film,
forming a silicon-containing film directly or indirectly on the resist underlayer film formed.

4. The pattern-forming method according to claim 2, wherein $Ar^{2A}$ and $R^{2A}$ in the formula (B) taken together represent the ring structure having 3 to 20 ring atoms together with the carbon atom to which $Ar^{2A}$ and $R^{2A}$ bond, and the ring structure having 3 to 20 ring atoms is a fluorene structure.

5. The composition according to claim 1, wherein $R^{2A}$ in the formula (1) is a monovalent aromatic hydrocarbon group.

6. The composition according to claim 1, wherein $Ar^{2A}$ and $R^{2A}$ in the formula (B) taken together represent the ring structure having 3 to 20 ring atoms together with the carbon atom to which $Ar^{2A}$ and $R^{2A}$ bond, and the ring structure having 3 to 20 ring atoms is an aromatic ring structure.

7. The composition according to claim 6, wherein the ring structure having 3 to 20 ring atoms is a fluorene structure.

* * * * *